(12) United States Patent
Hanke et al.

(10) Patent No.: US 8,816,474 B2
(45) Date of Patent: Aug. 26, 2014

(54) CAPACITOR STRUCTURE

(75) Inventors: Andre Hanke, Unterhaching (DE); Oliver Nagy, Vienna (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/187,407

(22) Filed: Aug. 7, 2008

(65) Prior Publication Data
US 2010/0032800 A1    Feb. 11, 2010

(51) Int. Cl.
*H01L 29/00* (2006.01)

(52) U.S. Cl.
USPC .............. 257/532; 257/534; 257/E29.343

(58) Field of Classification Search
USPC ............................ 257/532, 534, E29.343
See application file for complete search history.

(56) References Cited

U.S. PATENT DOCUMENTS

| | | | |
|---|---|---|---|
| 6,570,210 B1 | 5/2003 | Sowlati et al. | |
| 2002/0085336 A1 | 7/2002 | Winer et al. | |
| 2003/0020107 A1 * | 1/2003 | Bosco et al. | 257/296 |
| 2003/0183823 A1 | 10/2003 | Searls et al. | |
| 2006/0221541 A1 * | 10/2006 | Yeh et al. | 361/272 |
| 2007/0121273 A1 | 5/2007 | Yamamoto et al. | |
| 2007/0210417 A1 | 9/2007 | Binder et al. | |
| 2009/0267183 A1 * | 10/2009 | Temple et al. | 257/532 |

OTHER PUBLICATIONS

May 15, 2014 Office Action for German Patent Application 10 2009 030 026.0.

* cited by examiner

*Primary Examiner* — Thien F Tran
(74) *Attorney, Agent, or Firm* — Infineon Technologies AG (57) ABSTRACT

One or more embodiments relate to a semiconductor device, comprising: a substrate; and a plurality of first conductive vias, the first conductive vias electrically coupled together, each of the first conductive vias passing through the substrate; and a plurality of second conductive vias, the second conductive vias electrically coupled together, each of the second conductive vias passing through the substrate, the second conductive vias spacedly disposed from the first conductive vias.

23 Claims, 7 Drawing Sheets

CAPACITOR STRUCTURE

FIELD OF THE INVENTION

Generally, the present invention relates to semiconductor devices, and, in particular, to semiconductor devices having capacitors.

BACKGROUND OF THE INVENTION

Capacitors may be a part of a semiconductor device. Examples of capacitors include metal-insulator-metal or MIM capacitors and vertical-parallel-plate or VPP capacitors. New methods for making capacitors are needed.

SUMMARY OF THE INVENTION

One or more embodiments relate to a semiconductor device, comprising: a substrate; and a plurality of first conductive vias, the first conductive vias electrically coupled together, each of the first conductive vias passing through the substrate; and a plurality of second conductive vias, the second conductive vias electrically coupled together, each of the second conductive vias passing through the substrate, the second conductive vias spacedly disposed from the first conductive vias.

One or more embodiments relate to a semiconductor device, comprising: a substrate; and a capacitor including a first conductive plate spacedly disposed from a second conductive plate, the first conductive plate comprising a plurality of electrically coupled first conductive vias passing through the substrate, the second conductive plate comprising a plurality of electrically coupled second conductive vias passing through the substrate.

One or more embodiments relate to a capacitor structure, comprising: a first capacitor plate comprising a plurality of electrically coupled first conductive vias passing though a semiconductor substrate; and a second capacitor plate spaced disposed from the first capacitor plate, the second capacitor plate comprising a plurality of electrically coupled second conductive vias passing through the substrate.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1A:
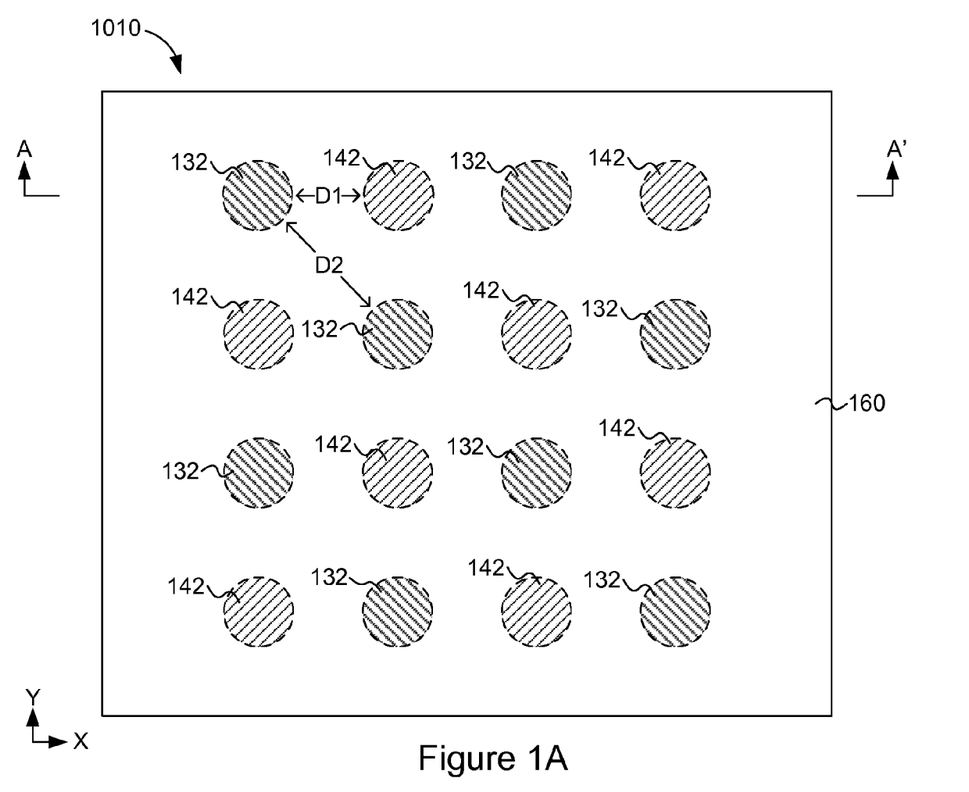
FIG. 1A is a view through a cross section of a semiconductor device which is an embodiment of the present invention.
Figure 1B:
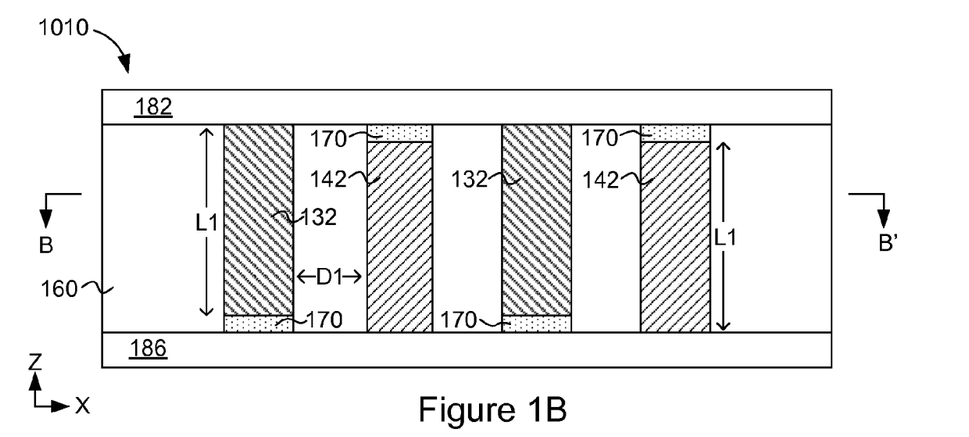
FIG. 1B is a cross sectional view of the embodiment of FIG. 1A.

FIGS. 1A and 1B show a semiconductor device 1010 which is an embodiment of the present invention. FIG. 1A is a cross-sectional view (looking down from above) of the cross section BB' of FIG. 1B. FIG. 1B is a cross sectional view through the cross section AA'. The semiconductor device 1010 comprises a substrate 160. The semiconductor device 1010 further comprises a plurality of first conductive vias 132 that pass through the substrate 160. Generally, there may be one or more first conductive vias 132. The semiconductor device 1010 further comprises a plurality of second conductive vias 142 that pass through the substrate 160. Generally, there may be one or more second conductive vias 142. The conductive vias may be referred to as substrate-through vias.

The first conductive vias 132 may be spacedly disposed from each other. The second conductive vias 140 may be spacedly disposed from each other.

The first conductive vias 132 may be spacedly disposed from the second conductive vias 142. The first conductive vias 132 may be electrically coupled together. The second conductive vias 142 may be electrically coupled together.

The first conductive vias 132 may be separated from the second conductive vias 142 by the substrate material 160. In one or more embodiments, the substrate material may comprise a non-conductor. In one or more embodiments, the substrate material may comprise a semiconductor. In one or more embodiments, the substrate material may comprise a dielectric. In one or more embodiments, an additional non-conductor, such as an additional dielectric, may be disposed between the first conductive vias 132 and the second conductive vias 142.

In one or more embodiments, the first conductive vias 132 are electrically coupled together to form a first plate of a capacitor. In one or more embodiments, the second conductive vias 132 are electrically coupled together to form a second plate of the same capacitor. The first and second capacitor plates may have any shape. A capacitor plate may also be referred to as a capacitor electrode.

Hence, the semiconductor device 1010 comprises a capacitor. The capacitor comprises a first conductive plate and a second conductive plate which may be spacedly disposed from the first conductive plate. The first conductive plate comprises one or more electrically coupled first conductive vias 132 which pass through a substrate 160. The second conductive plate comprises one or more electrically coupled second conductive vias 142 which pass through a substrate 160. The substrate 160 may be disposed between the first and second conductive plate of the capacitor.

The one or more first conductive vias 132 may all be electrically coupled to an upper conductive layer 182. The one or more second conductive vias 142 may all be electrically coupled to a lower conductive layer 186. The upper conductive layer 182 may be disposed above the substrate 160 while the lower conductive layer may be disposed below the substrate 160 so that the upper conductive layer is spacedly disposed from the lower conductive layer.

In one or more embodiments, the upper conductive layer 182 may be spacedly disposed from the lower conductive layer 186. In one or more embodiments, the upper conductive layer 182 may be electrically isolated from the lower conductive layer 186.

In the embodiment shown in FIG. 1B, the first conductive vias 132 are electrically insulated from the lower conductive layer 186 by dielectric layers 170. The second conductive vias 142 are electrically insulated from the upper conductive layer 182 by the dielectric layers 170.

From the top view of FIG. 1A and the cross sectional view of FIG. 1B, it is seen that the first conductive vias 132 may be disposed in a staggered arrangement between the second conductive vias 142. In the embodiment shown, the first and second conductive vias 132, 142 are arranged in rows and columns such that the first and second conductive vias 132, 142 alternate along the rows as well as along the columns.

FIG. 1A shows that, in an embodiment, the average distance between a first conductive via 132 and a second conductive via 142 is D1. FIG. 1A shows that, in an embodiment, the average distance between a first conductive via 132 and another first conductive via 132 is D2. Likewise, the average distance between a second conductive via 142 and another second conductive via 142 may also be D2.

In one or more embodiments, the average distance D1 between a first conductive via 132 and a second conductive via 142 may be less than the average distance D2 between a first conductive via 132 and another first conductive via 132. Other arrangements are also possible and the present invention is not limited to this arrangement.

FIG. 1B shows that the average length of a first and second conductive via 132, 142 is a length L1. In one or more embodiments, the average length L1 of the conductive vias 132, 142 is greater than the average distance D1 between first and second conductive vias. That is, L1>D1. In one more embodiments, the average length L1 is greater than 10 times D1 (10–D1). In one more embodiments, the average length L1 is greater than 25 times D1 (25×D1). In one more embodiments, the average length L1 is greater than 50 times D2 (50×D1). In one more embodiments, the average length L1 is greater than 100 times D1 (100×D1).

Figure 2:
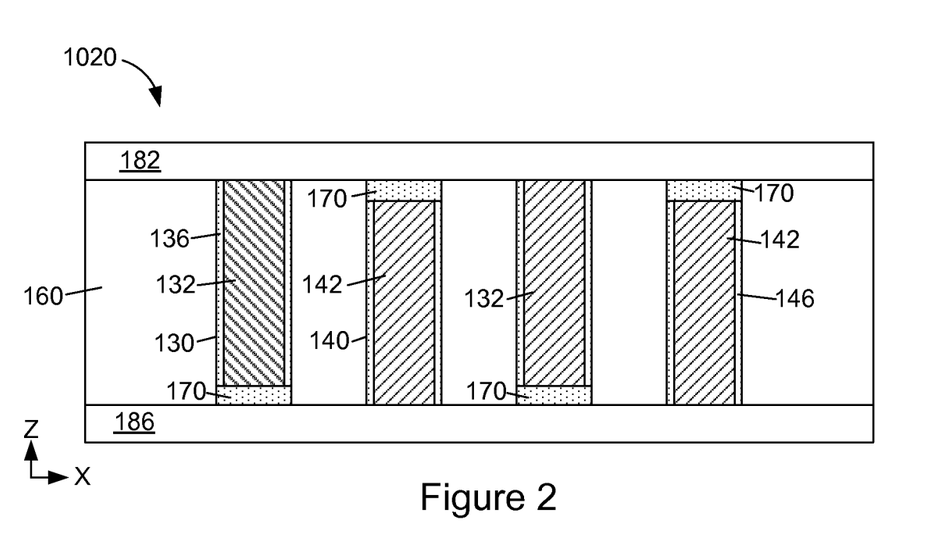
FIG. 2 is a cross sectional view of a semiconductor device which is an embodiment of the present invention.

Another embodiment of the invention is shown in FIG. 2. FIG. 2 shows a cross sectional view of a semiconductor device 1020. In this embodiment, a dielectric layer 136 may be disposed about the sidewall surface of each first conductive via 132. The dielectric layer 136 may laterally surround the first conductive via 132. The dielectric layer 136 may be disposed between the sidewall surface of the conductive via 132 and the substrate 160.

Likewise, a dielectric layer 146 disposed about the sidewall surface of each second conductive via 142. the dielectric layer 146 may laterally surround the second conductive via 142. The dielectric layer 146 may be disposed between the sidewall surface of the conductive via 142 and the substrate 160. The first conductive vias 132 collectively form a first conductive plate of a capacitor for the device 1020. Likewise, the second conductive vias 142 collectively form a second conductive plate of the same capacitor for the device 1020.

It is seen that, in the embodiments shown in FIG. 1A, FIG. 1B and FIG. 2, the first conductive vias 132 may overlap the second conductive vias 142 in the direction which is perpendicular to the substrate (in the "Z" direction shown in FIG. 1B and in FIG. 2).

Figure 3A:
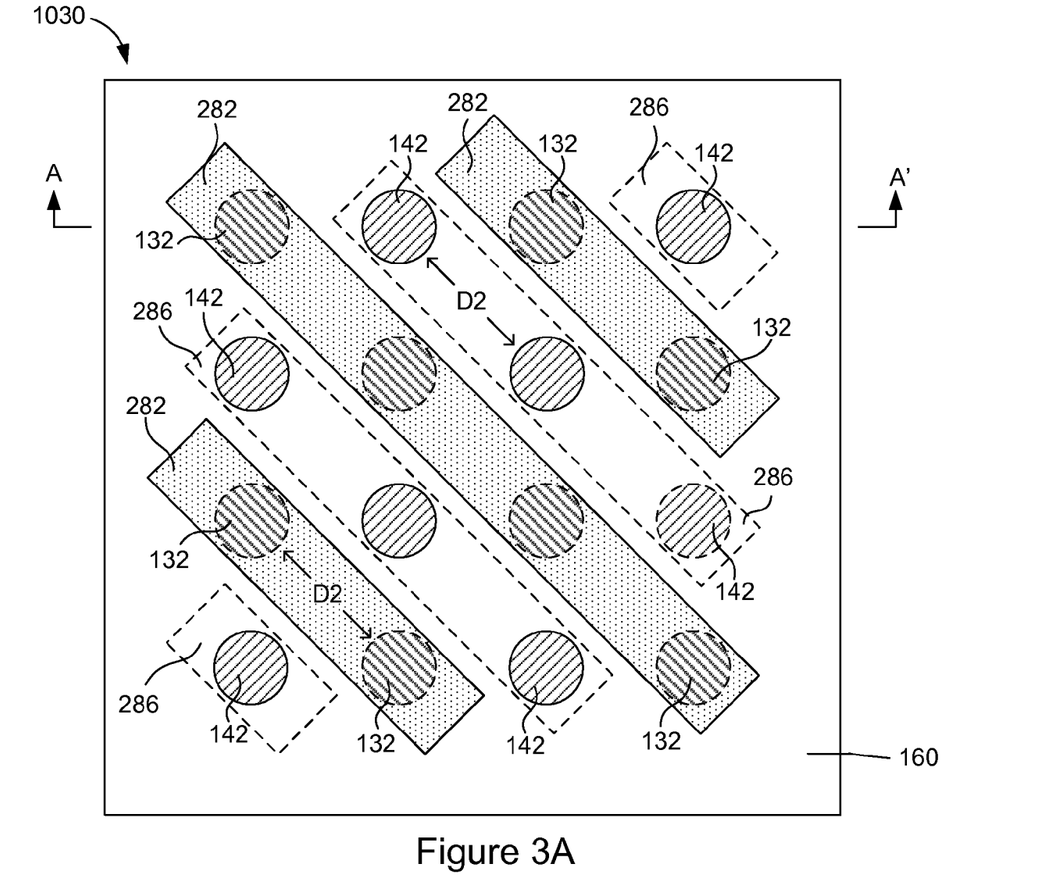
FIG. 3A is a top view of a semiconductor device which is an embodiment of the present invention.
Figure 3B:
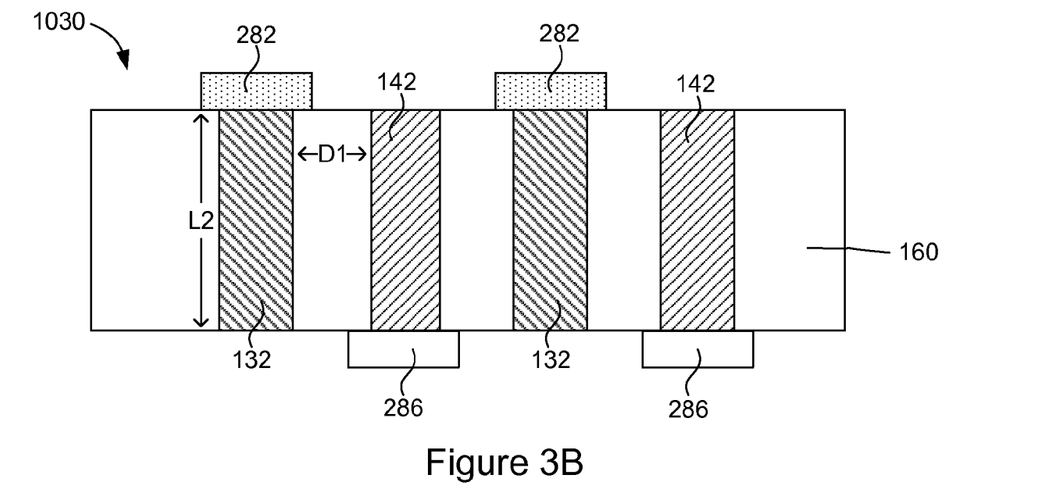
FIG. 3B is a cross sectional view of the embodiment of FIG. 3A.

FIGS. 3A and 3B show a semiconductor device 1030 which is an embodiment of the present invention. FIG. 3A is a top view of the device 1030. FIG. 3B is a cross sectional view through the cross section AA'. The semiconductor device 1030 comprises a substrate 160. The semiconductor device 1030 further comprises a plurality of first conductive vias 132 that pass through the substrate 160. Generally, there may be one or more first conductive vias 132. The semiconductor device 1030 further comprises a plurality of second conductive vias 142 that pass through the substrate 160. Generally, there may be one or more second conductive vias 142.

The first conductive vias 132 may be spacedly disposed from each other. The second conductive vias 142 may be spacedly disposed from each other. The first conductive vias 132 may be spacedly disposed from the second conductive vias 142. The first conductive vias 132 may be electrically coupled together. The second conductive vias 142 may be electrically coupled together.

The first conductive vias 132 may be separated from the second conductive vias 142 by substrate material 160. In one or more embodiments, the substrate material comprises a non-conductor. In one or more embodiments, the non-conductor may comprise a semiconductor. In one or more embodiments, the non-conductor may comprise a dielectric. In one or more embodiments, an additional non-conductive (such as an additional dielectric) may be disposed between the first conductive vias 132 and the second conductive vias 142.

In one or more embodiments, the first conductive vias 132 are electrically coupled together to form a first plate of a capacitor. In one or more embodiments, the second conductive vias 132 are electrically coupled together to form a second plate of the same capacitor. The first and second plates may each have any shape.

Hence, the semiconductor device 1030 comprises a capacitor. The capacitor comprises a first conductive plate and a second conductive plate which may be spacedly disposed from the first conductive plate. The first conductive plate comprises one or more electrically coupled first conductive vias 132 which pass through the substrate 160. The second conductive plate comprises one or more electrically coupled second conductive vias 142 which pass through a substrate 160. The substrate 160 may comprise a non-conductor. The non-conductor may comprise a semiconductor. The non-conductor may comprise a dielectric. Hence, the non-conductor (in the form of the substrate material) may be disposed between the first and second capacitor plates. In one or more embodiments, an additional dielectric material may be placed between the first and second capacitor plates.

Referring to FIGS. 3A and 3B, it is seen that the first conductive vias 132 are electrically coupled to one or more upper conductive strips 282 while the second conductive vias 136 are electrically coupled to one or more lower conductive strips 286. The upper conductive strips 282 are disposed above the substrate 160 while the lower conductive strips are disposed below the substrate 160. The upper conductive strips 282 may be spacedly disposed from the lower conductive strips 286. In one or more embodiments, the upper conductive strips 282 may be electrically isolated from the lower conductive strips 286. All of the upper conductive strips 282 may be spacedly disposed from each other. All of the upper conductive strips 282 may be electrically coupled together. All of the lower conductive strips 286 may be spacedly disposed from each other.

In the embodiment shown in FIG. 3A, the first conductive vias 132 which are on the same diagonal are electrically coupled to the same upper conductive strip 282. Likewise, the second conductive vias 136 on the same diagonal are all electrically coupled to the same lower conductive strip 286.

All of the upper conductive strips 286 may be electrically coupled together so that all of the first conductive vias 132 are electrically coupled together. Likewise, all of the lower conductive strips 286 may be electrically coupled together so that all of the second conductive vias 136 are electrically coupled together.

FIG. 3B shows that, in an embodiment, the average distance between a first conductive via 132 and a second conductive via 142 is D1. FIG. 3A shows that, in an embodiment, the average distance between a first conductive via 132 and another first conductive via 132 is D2. Likewise, the average distance between a second conductive via 142 and another second conductive via 142 may also be D2.

In one or more embodiments, the average distance D1 between a first conductive via 132 and a second conductive via 142 may be less than the average distance D2 between a first conductive via 132 and another first conductive via 132. Other arrangements are also possible and the present invention is not limited to this arrangement.

FIG. 3B shows that the average length of a first and second conductive via 132, 142 is a length L2. In one or more embodiments, the average length L2 of the conductive vias 132, 142 is greater than the average distance D1 between first and second conductive vias. That is, L2>D1. In one more embodiments, the average length L2 is greater than 10 times D1 (10×D1). In one more embodiments, the average length L2 is greater than 25 times D1 (25×D1). In one more embodiments, the average length L2 is greater than 50 times D2 (50×D1). In one more embodiments, the average length L2 is greater than 100 times D1 (100×D1).

In an embodiment, the upper conductive strips 282 may be conductive lines. The conductive lines may be part of one or more metallization layers of the device. The lower conductive strips 286 may be formed as conductive strips on the bottom side of a wafer.

Figure 4:
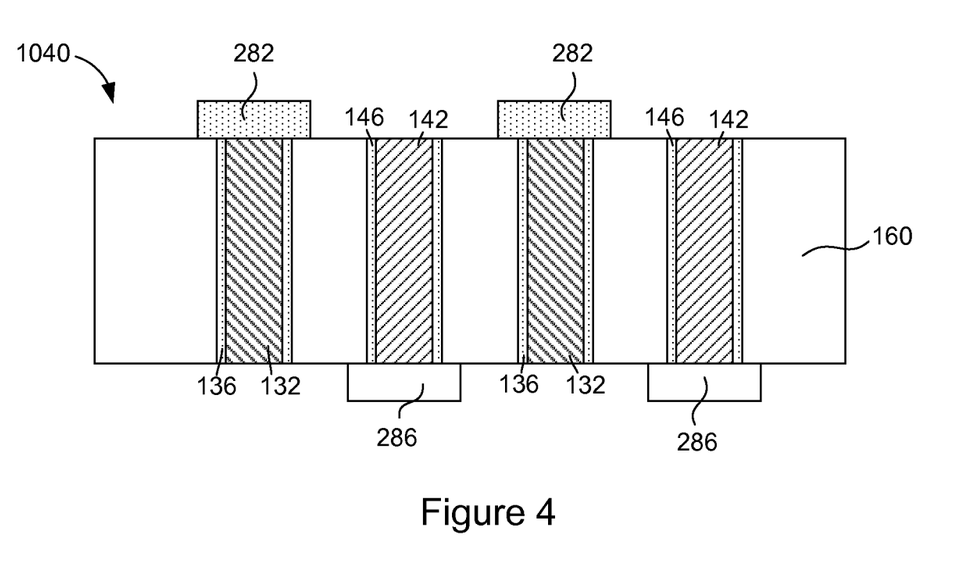
FIG. 4 is a cross sectional view of a semiconductor device which is an embodiment of the present invention.

Another embodiment of the invention is shown in FIG. 4. FIG. 4 shows a cross sectional view of a semiconductor device 1040. In this embodiment, dielectric layer 136 may be disposed about the sidewall surface of each of the first conductive via 132. A dielectric layer 136 may laterally surround each of the first conductive vias 132. The dielectric layers 136 are disposed between the conductive first conductive vias 132 and the substrate 160. The dielectric layers 136 may electrically insulate the conductive vias 132 from the substrate 160.

Likewise, a dielectric layer 146 may be disposed about the sidewall surface of each second conductive via 142. A dielectric layer 146 may laterally surround each of the second conductive vias 146. The dielectric layers 146 may be disposed between the second conductive vias 142 and the substrate 160. The dielectric layers 146 may electrically insulate the conductive vias 142 from the substrate 160.

The dielectric layers 136, 146 may also serve to modify the dielectric constant of the non-conductive material between the first and second conductive vias and hence between the first and second capacitor plates.

Figure 5A:
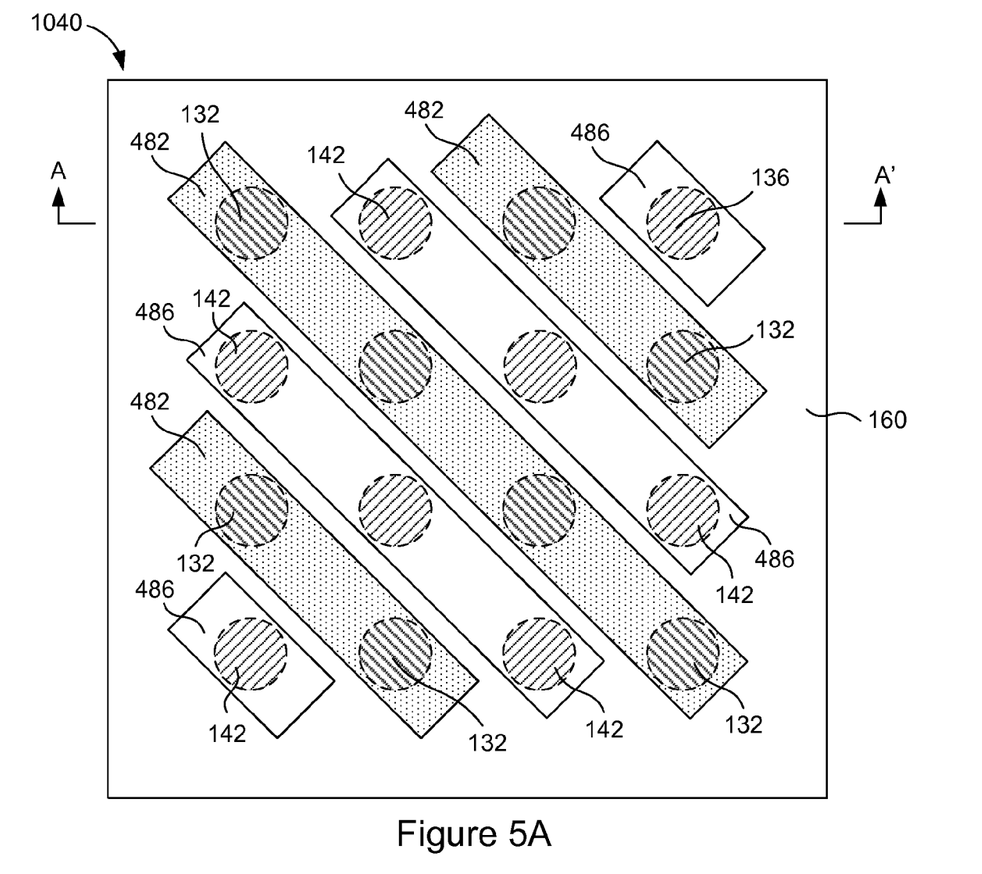
FIG. 5A is a top view of a semiconductor device which is an embodiment of the present invention.
Figure 5B:
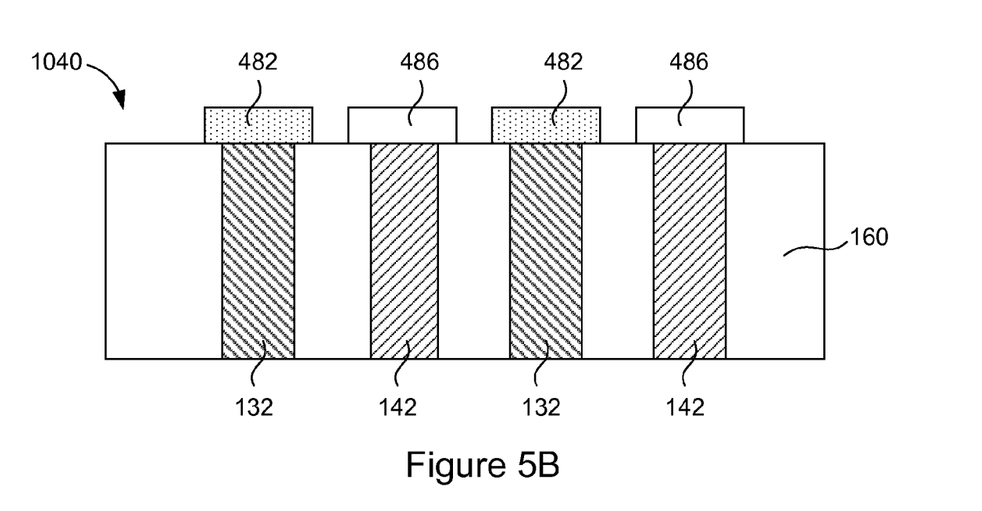
FIG. 5B is a cross sectional view of the embodiment shown in FIG. 5A.

FIGS. 5A and 5B show another embodiment of the present invention. FIGS. 5A and 5B show a semiconductor device 1050 which is an embodiment of the present invention. The embodiment shown in FIG. 5A and 5B is the same as that shown in FIGS. 3A and 3B except all of the conductive strips are now upper conductive strips. Hence, the upper conductive strips 282 from FIGS. 3A, 3B are shown as first upper conductive strips 482 in FIGS. 5A, 5B. In addition, the lower conductive strips 286 shown in FIGS. 3A, 3B have been replaced with a second upper conductive strips 486 shown in FIGS. 5A, 5B.

FIG. 5A shows a top view of a semiconductor device 1050 while FIG. 5B shows a cross sectional view through the cross section AA'. In this embodiment, the first conductive vias 132 and the second conductive vias 142 all pass through the substrate 160. The first conductive vias 132 are coupled to first upper conductive strips 482 while the second conductive vias 142 are coupled to second upper conductive strips 486.

The first upper conductive strips 482 are spacedly disposed from the second upper conductive strips 486. All of the first upper conductive strips 486 may be electrically coupled together and all of the second upper conductive strips 486 may be electrically coupled together. In one or more embodiments, all of the first conductive strips 482 may be spacedly disposed from each other. In one or more embodiments, all of the second conductive strips 486 may be spacedly disposed from each other.

In an embodiment, the first conductive strips 482 may be conductive lines. In an embodiment, the second conductive layers 486 may be conductive lines. The conductive lines may be conductive lines belonging to one or more metallization levels (e.g. Metal-1, Metal-2, etc.).

The first conductive vias 132 are spacedly disposed from the second conductive vias 142 by the substrate 160. The first conductive vias 132 are electrically coupled together to collectively form a first conductive plate of a capacitor. The second conductive vias 142 are electrically coupled together to collectively form a second conductive plate of a capacitor.

Figure 6:
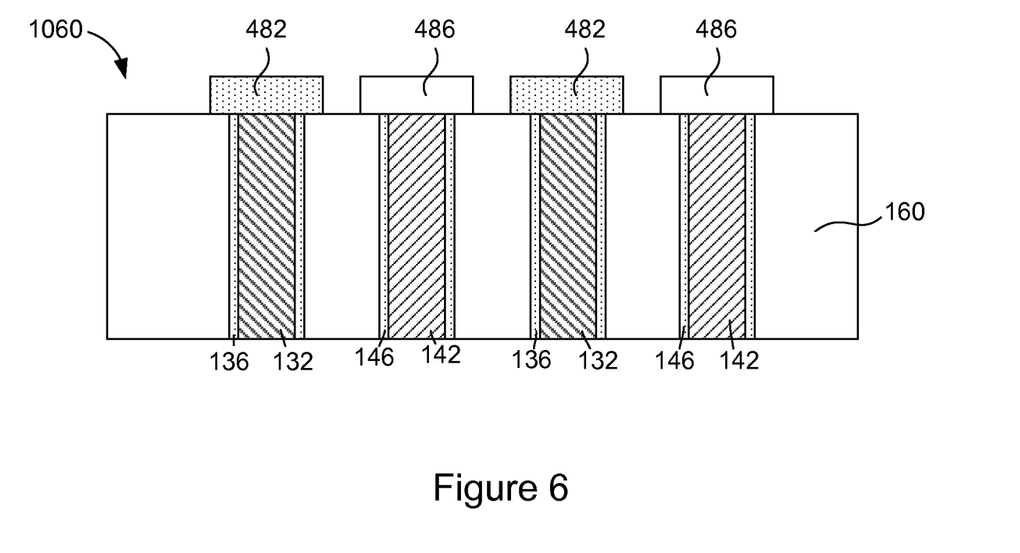
FIG. 6 is a cross sectional view of a semiconductor device which is an embodiment of the present invention.

Another embodiment of the invention is shown in FIG. 6. FIG. 6 shows a cross sectional view of a semiconductor device 1060. In this embodiment, a dielectric layer 136 is disposed about sidewall surface of each first conductive via 132. Likewise a dielectric layer 142 is disposed about the sidewall surface of each second conductive via 142.

Figure 7A:
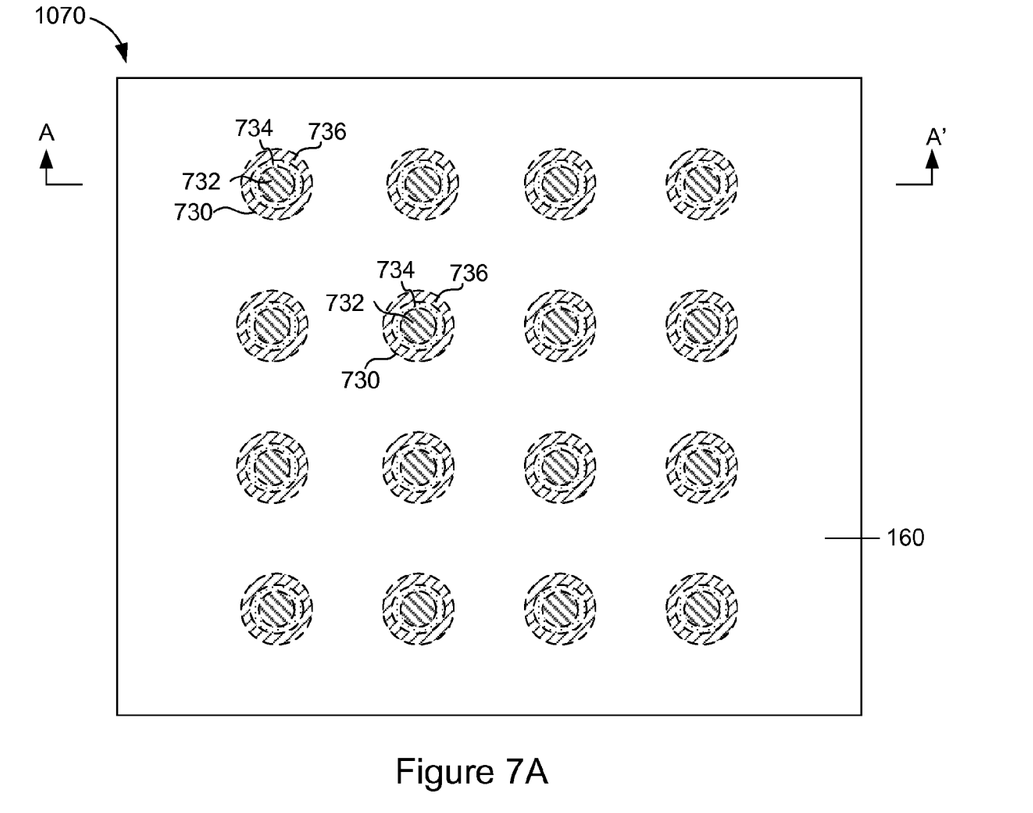
FIG. 7A is a view through a lateral cross section of a semiconductor device which is an embodiment of the present invention.
Figure 7B:
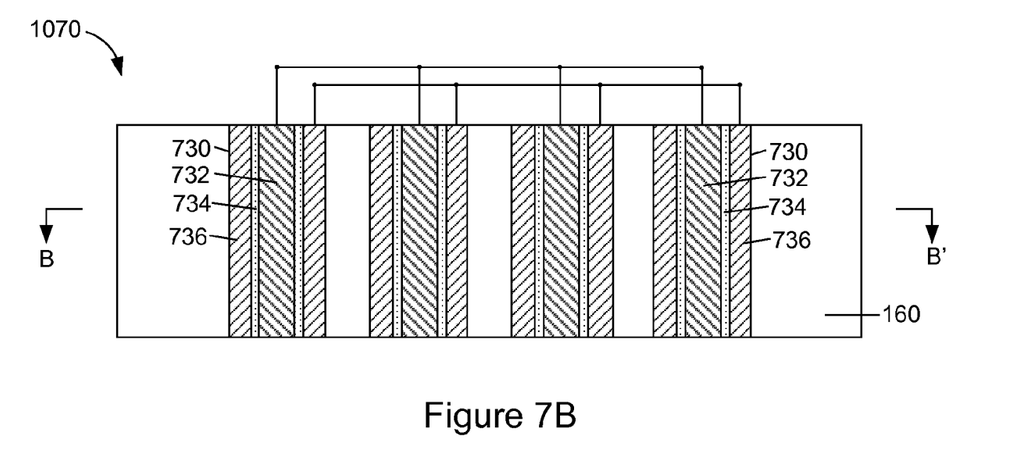
FIG. 7B is a cross sectional view of the embodiment shown in FIG. 7A.

FIGS. 7A and 7B shows a semiconductor device 1070 which is another embodiment of the invention. FIG. 7A shows a cross sectional view of the device 1070, looking from the top, through the cross section BB' of FIG. 7B. FIG. 7B shows a cross sectional view of the device 1070 through the cross section AA'. In this embodiment, there is a plurality of via arrangements 730. Each of the via arrangements 730 comprises a first conductive via 732 which passes through the substrate 160. Each of the via arrangements 730 further comprises a second conductive via 736 passes through the substrate 160.

The dielectric layer 734 may be disposed about the sidewall surface of the first conductive via 732. The dielectric layer 734 may laterally surround the first conductive layer 732. The second conductive via 736 is disposed about the outer sidewall surface of the dielectric layer 734. The second conductive via 736 laterally surrounds the first conductive 732. The dielectric layer 734 may be between the first conductive via 732 and the second conductive via 736.

All of the first conductive vias 732 are electrically coupled together to form a first plate of a capacitor. Likewise, all of the second conductive vias 736 are electrically coupled together to form a second plate of a capacitor. In the embodiment shown in FIGS. 7A, 7B, the first conductive vias 732 may be electrically coupled together by a first upper conductive layer. Likewise, the second conductive vias 736 may be electrically coupled together by a second upper conductive layer.

In another embodiment, it is possible that another dielectric layer be disposed about the outer sidewall surface of each second conductive via 736 (e.g. between the second conductive via 736 and the substrate 160.

The first and second conductive vias as well as the conductive layer and conductive lines may comprise any conductive material. In one or more embodiments, the conductive material may comprise a metallic material. The metallic material may comprise a pure metal. The metallic material may comprise a metal alloy. The metallic material may comprise one or more elements from the group consisting of Al, Cu, Au, Ag, Co, W, Ti, and Ta. Examples of possible materials include, but not limited to, pure aluminum, aluminum alloy, pure copper, copper alloy, pure gold, gold alloy, pure silver, silver alloy, pure cobalt, cobalt alloy, pure tungsten, tungsten alloy, pure titanium, titanium alloy, tantalum and tantalum alloy. Combinations of materials may also be used. The conductive material may be a silicon material. The conductive material may be a polysilicon material. The conductive material may be a doped polysilicon material. The doped material may be n-doped and/or p-doped. The conductive material may also be a monocrystalline silicon material such as a doped monocrystalline silicon material. The doped material may be p-doped or n-doped.

The conductive material may also include materials such as graphite as well as conductive polymers. The first and second conductive vias as well as the conductive layers and conductive lines may comprise the same conductive materials or different conductive materials.

Generally, the substrate for the semiconductor devices described herein may be any type of substrate. In an embodiment, the substrate 160 may be a p-type substrate. However, more generally, in one or more embodiments of the invention, the substrate may be a silicon substrate or other suitable substrate. The substrate may be a bulk mono-crystallayer silicon substrate (or a grown thereon or otherwise formed therein), a of (110) silicon on a (100) silicon wafer, a silicon-on-insulator (SOI) substrate. The SOI substrate may, for example, be formed by a SIMOX process. The substrate may be a silicon-on-sapphire (SOS) substrate. The substrate may be a germanium-on-insulator (GeOI) substrate. The substrate may include one or more materials such as semiconductor materials such as silicon germanium, germanium, germanium arsenide, indium arsenide, indium arsenide, indium gallium arsenide, or indium antimonide.

In one or more embodiments, the substrate may comprises a non-conductor. In one or more embodiments, the substrate may comprise a semiconductor. In one or more embodiments, the substrate may comprise a dielectric.

All of the dielectric layers described above may comprise any dielectric material. In one or more embodiments, the dielectric material may comprise an oxide, a nitride, an oxynitride or combinations thereof.

The conductive vias passing through a substrate may be formed in many different ways. The conductive vias may be formed by 1) forming openings partially through a substrate, 2) forming a conductive material within the openings, and 3) thinning the substrate by removing a bottom portion of the substrate until the conductive material within the openings is exposed.

In the embodiment shown, for example, in FIGS. 3A, 3B, the conductive material formed in the openings may fill the openings so as to form a plug shaped conductive via. However, in other embodiments, the conductive material may be conformally deposited so that the conductive via takes the form of a conductive liner or a conducive spacer that lines the sidewalls of the opening.

Referring to the embodiment shown in FIG. 4, the structure 1040 may be formed by 1) forming openings partially though a substrate, 2) forming a dielectric layer 136 conformally along the sidewalls of the opening, 3) forming a conductive material within the openings and 4) thinning the substrate by removing a bottom portion of the substrate until the conductive material is exposed. Once again, the shaped of the conductive via is not limited to any particular shape. In one or more embodiments, it may be plug shaped. However, the conductive material may be conformally deposited so that the shape of the conductive via is that of a conductive liner, conductive spacer or conductive shell.

The first capacitor plate of the capacitor of the present invention may be electrically coupled to a first node on the same chip (semiconductor device) as the capacitor or to a first node on a different chip from the capacitor. Likewise, the second capacitor plate of the same capacitor may be electrically coupled to a second node on the same chip as the capacitor or to a node on a chip which is different from the capacitor.

The upper conductive layers and/or the lower conductive layers that are described above may be used to electrically couple the first and second capacitor plates to nodes that are either on the same chip or on a different chip.

The upper conductive layers or upper conductive strips described above may, for example, comprise conductive lines of metallization levels, conductive vias that couple conductive lines in one metallization level to conductive lines in another metallization level (e.g. that go through the interlevel dielectric layers of the chip) and/or electrical contacts that couple the first metallization level to the substrate. The upper conductive layers or strips can be used to couple the one or both of the capacitor plates to on the same chip or on a different chip.

The lower conductive layers or strips described above may themselves be electrically coupled to conductive lines of the metallization layers, to the conductive vias interconnecting the conductive lines, and/or to the electrical contacts. The lower conductive layers or strips may be used to electrically couple one or more of the conductive plates to nodes on the same chip or on a different chip.

The disclosure herein is presented in the form of detailed embodiments described for the purpose of making a full and complete disclosure of the present invention, and that such details are not to be interpreted as limiting the true scope of this invention as set forth and defined in the appended claims.

What is claimed is:

1. A semiconductor device, comprising:
a semiconductor substrate; and
a plurality of first conductive vias, said first conductive vias electrically coupled together to form a first plate of a capacitor, each of said first conductive vias passing through said semiconductor substrate; and
a plurality of second conductive vias, said second conductive vias electrically coupled together to form a second plate of said capacitor, each of said second conductive vias passing through said semiconductor substrate, said second conductive vias spacedly disposed from said first conductive vias,
wherein an average length of the first and second conductive vias is greater than 10 times an average distance between the first conductive vias and second conductive vias.

2. The semiconductor device of claim 1, wherein said first conductive vias are staggered between said second conductive vias.

3. The semiconductor device of claim 1, wherein said first and second conductive vias are arranged in rows and columns, said first conductive vias alternate with said second conductive vias along said rows and along said columns.

4. The semiconductor device of claim 1, wherein said semiconductor device comprises a capacitor, said capacitor comprising a first capacitor plate spacedly disposed from a second capacitor plate, said first capacitor plate comprising said first conductive vias, said second capacitor plate comprises said second conductive vias.

5. The semiconductor device of claim 1, wherein said first and second conductive vias comprise a metallic material.

6. The device of claim 1, further comprising a dielectric layer laterally surrounding each of said first and second conductive vias.

7. The device of claim 1, wherein a material of said semiconductor substrate is disposed between said first and said second conductive vias.

8. The device of claim 1, wherein each of said second conductive vias laterally surrounds a respective one of said first conductive vias.

9. The device of claim 1, wherein said semiconductor substrate is a silicon substrate.

10. The semiconductor device of claim 1, wherein the average length of the first and second conductive vias is greater than 25 times the average distance between the first conductive vias and second conductive vias.

11. A semiconductor device, comprising:
a semiconductor substrate; and
a capacitor including a first conductive capacitor plate spacedly disposed from a second conductive capacitor plate, said first conductive capacitor plate comprising a plurality of electrically coupled first conductive vias passing through said semiconductor substrate, said second conductive capacitor plate comprising a plurality of electrically coupled second conductive vias passing through said semiconductor substrate,
wherein an average length of the first and second conductive vias is greater than 10 times an average distance between the first and second conductive vias.

12. The device of claim 11, wherein a material of said semiconductor substrate is between said first conductive capacitor plate and said second conductive capacitor plate.

13. The device of claim 11, wherein said first and second conductive vias comprise a metallic material.

14. The device of claim 11, wherein said semiconductor substrate is a silicon substrate.

15. The semiconductor device of claim 11, wherein the average length of the first and second conductive vias is greater than 25 times the average distance between the first conductive vias and second conductive vias.

16. A capacitor structure, comprising:
a first capacitor plate comprising a plurality of electrically coupled first conductive vias passing through a semiconductor substrate; and
a second capacitor plate spacedly disposed from said first capacitor plate, said second capacitor plate comprising a plurality of electrically coupled second conductive vias passing through said semiconductor substrate,
wherein an average length of the first and second conductive vias is greater than 10 times an average distance between the first and second conductive vias.

17. The capacitor structure of claim 16, wherein said first conductive vias are disposed in a staggered arrangement between said second conductive vias.

18. The capacitor structure of claim 16, wherein said first and second conductive vias are arranged in rows and columns, said first conductive vias alternate with said second conductive vias along said rows and along said columns.

19. The capacitor structure of claim 16, wherein said first and second conductive vias comprise a metallic material.

20. The capacitor structure of claim 16, wherein a material of said semiconductor substrate is disposed between said first conductive vias and said second conductive vias.

21. The capacitor structure of claim 16, wherein each of said second conductive vias laterally surrounds a respective one of said first conductive vias.

22. The capacitor structure of claim 16, wherein said semiconductor substrate is a silicon substrate.

23. The semiconductor device of claim 16, wherein the average length of the first and second conductive vias is greater than 25 times the average distance between the first conductive vias and said second conductive vias.

* * * * *